United States Patent [19]

Wiegand

[11] Patent Number: 4,713,662
[45] Date of Patent: Dec. 15, 1987

[54] MODULATED DIGITAL RADIO FREQUENCY MEMORY

[75] Inventor: Richard J. Wiegand, Severna Park, Md.

[73] Assignee: Westinghouse Electric Corp., Pittsburgh, Pa.

[21] Appl. No.: 919,942

[22] Filed: Oct. 17, 1986

[51] Int. Cl.[4] .............................................. G01S 7/38
[52] U.S. Cl. ...................................... 342/13; 455/91
[58] Field of Search .................. 342/15, 13; 455/18, 455/91, 94, 102, 108, 115, 125; 375/3

[56] References Cited

U.S. PATENT DOCUMENTS

| | | |
|---|---|---|
| 3,947,827 | 3/1976 | Dautremont, Jr. et al. ......... 340/173 RC |
| 3,991,409 | 11/1976 | Dautremont, Jr. et al. ......... 340/173 RC |
| 4,011,561 | 3/1977 | Dounce . |
| 4,021,804 | 5/1977 | Dounce et al. . |
| 4,095,224 | 6/1978 | Dounce et al. . |
| 4,450,447 | 5/1984 | Zebker et al. . |

Primary Examiner—Thomas H. Tarcza
Assistant Examiner—Donald Hayes, Jr.
Attorney, Agent, or Firm—W. G. Sutcliff

[57] ABSTRACT

A digital radio frequency memory (DRFM) system for storing and retrieving radio frequency signals in a digital memory. The system includes a digital memory, digital converters at the input and output of the digital memory, and input and output mixers. The RF signal to be stored is applied to the input mixer along with a modulated local oscillator signal to produce an IF signal which is converted into digital values for storage in the digital memory. When the stored digital values are retrieved from the memory to reproduce the RF signal, they are converted back into an analog IF signal which passes through a low-pass filter before being applied to the output mixer. The local oscillator signal, modulated with the same waveform used in storing the digital values, is also applied to the output mixer to provide the reconstructed RF signal. A pseudo random, discrete digital valued waveform is used to phase modulate the local oscillator signal in the preferred embodiment of the invention. This arrangement permits spur free, image free reproduction of RF signals over a large bandwidth.

13 Claims, 10 Drawing Figures

MODULATED DIGITAL RADIO FREQUENCY MEMORY

BACKGROUND OF THE INVENTION

This invention relates, in general, to digital electronic memories and, more specifically, to digital radio frequency memories suitable for use in radar countermeasures equipment.

Active radar jammers are used in the field of electronic countermeasures to confuse or counter a system originating radar signals. In some situations, it is desirable to return signals to the radar system which are exact copies of the arriving radar signal. In other situations, it is desirable to return signals to the radar system which have characteristics other than that of the received radar signal in order to further confuse the radar system. In any event, it is usually necessary for the countermeasure system to store the received radar signal and reproduce it at a later time.

Previously, delay lines of various types have been used to effectively store the received radar signal for a short period of time and make the stored radar signal available at the later time. One of the disadvantages of delay lines is that the delay cannot be electronically changed easily and that it is difficult to obtain reasonably long delay periods. An improvement over the delay line technology has been achieved by the use of digital radio frequency memories (DRFMs) which convert RF signals down to a lower IF frequency for storage into a digital memory device. The digital memory can be controlled similarly to the digital memory of a computer and the stored values representing the radar signal can be recalled at any time delay desired. Further manipulation of the digital values to produce changes in the replicated signal are also conveniently done by digital processes.

The usual method of employing DRFMs for storing radio frequency signals uses a two-channel (quadrature) memory system, usually denoted as the I and Q channels, with each channel storing digital values representing the RF signal displaced 90 degrees in phase. The maximum usable instantaneous bandwidth (IBW) of the memory system is one-half the sampling rate of the digital converters used in the DRFM, based upon the limitations governed by the Nyquist Sampling Theorem. To improve the amplitude dynamic range of the DRFM, to maximize the instantaneous bandwidth, and to minimize the digital storage bit requirements needed, one-bit sampling techniques are used in most DRFMs. Although one-bit sampling provides the advantages of increased dynamic range and reduced storage requirements, a large number of spurious frequencies, or unwanted spectral lines (spurs), are produced in the IF signal and ultimately in the reproduced RF signal because of the mixing processes used in the DRFM.

Having a large instantaneous bandwidth is advantageous from the standpoint that it allows radar signals over a wider range to be detected, stored and jammed by the countermeasure equipment. According to the prior art, the most efficient way to obtain reasonably large bandwidths was to use the I-Q two-channel storage system which stores the received signal into two different memory banks. However, the cost and size of such a two-channel system is a disadvantage in that a large amount of hardware is necessary to implement the system. Also, the two-channel system contains a non-performance region when the radar RF signal is close to the local oscillator frequency of the memory system.

Therefore, it is desirable, and it is an object of this invention, to provide an RF memory system which uses less digital memory than that of the conventional two-channel system, and which uses a smaller number of the associated components, such as couplers, mixers, converters, and splitters. It is also desirable to provide a digital memory system for RF signals which eliminates the non-performance region when the RF signal is near the local oscillator signal, and which eliminates or greatly reduces the number of spurs contained in the IF spectrum stored in the digital memory, while maintaining the advantages of one-bit sampling.

SUMMARY OF THE INVENTION

There is disclosed herein a new and useful digital radio frequency memory (DRFM) system for use as a coherent radio frequency memory in a military electronic countermeasure system. The memory system includes a digital memory, an analog-to-digital converter at the input of the digital memory, a digital-to-analog converter at the output of the digital memory, and input and output mixers. The incoming RF signal, which can be a pulsed radar signal, is applied to the input mixer along with a modulated local oscillator signal to produce an IF signal for application to the analog-to-digital converter. Digital values from this converter representing the RF signal are stored in the memory. When the stored digital values are retrieved to reconstruct the incoming RF signal, they are changed to an analog IF signal and pass through a low-pass filter before being applied to the output mixer. The local oscillator signal, modulated with an identical waveform used during storage of the digital values, is also applied to the output mixer to produce the output RF signal from the mixer.

The local oscillator can be frequency modulated directly or can be modulated by a phase modulator. The modulation waveform can be a repeating pattern which would be produced during signal storage and when the signal is to be reproduced at the output mixer. A random modulation waveform is preferred as it gives better spurious signal (spur) rejection. A pseudo random waveform which repeats periodically is sufficient in most applications for spur reduction and is relatively easy to generate and duplicate.

The modulation on the local oscillator signal causes the spurs to decorrelate in the output signal when it is converted by the mixers. The spurs, rather than being at a level sufficient to influence the intelligence in the converted signal, are spread over a noise floor in the signal and are not detrimental to the use of the signals in electronic countermeasure applications. Increasing the frequency of modulation reduces the energy in the spurs. Since this modulation also reduces the mixer images as well as the sampling spurs, the DRFM of this invention can function properly with only a one-channel digital memory rather than the two-channel I and Q system used according to the prior art to eliminate the mixer images. This alone provides for an approximately 50 percent reduction in digital memory requirements of the invention compared to prior art DRFMs, as well as a reduction in other system components.

Because of the construction and modulation techniques used in the DRFM of this invention, a wider bandwidth may be employed than with prior art DRFMs. Conventional two-channel DRFMs have been limited to a bandwidth determined by the Nyquist Sampling Theorem, with the bandwidth being usable up to only the sampling frequency of the digital converters used in that type of system, for a maximum IF of half the sampling frequency. The present invention provides a usable IF up to the full sampling frequency before spurs in the signal spectrum become a problem. This bandwidth enhancement provides another digital memory hardware savings of 50 percent over conventional systems providing the same bandwidth coverage, thereby providing an overall 75 percent reduction in digital memory requirements when the signal channel capability is included.

BRIEF DESCRIPTION OF THE DRAWINGS

Further advantages and uses of this invention will become more apparent when considered in view of the following detailed description and drawings, in which.

DESCRIPTION OF THE PREFERRED EMBODIMENTS

Figure 1:
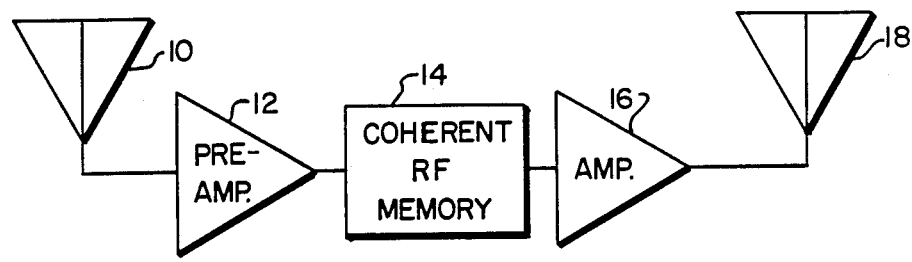
FIG. 1 is a generalized block diagram of a radar countermeasure system.

Throughout the following description, similar reference characters refer to similar elements or members in all of the figures of the drawings.

Referring now to the drawings, and to FIG. 1 in particular, there is shown, in block form, an electronic countermeasure (ECM) system for jamming or confusing radar systems. The ECM system includes the receiving antenna 10, the preamplifier 12, the coherent RF memory 14, the RF power amplifier 16, and the transmitting antenna 18. Incoming radar signals received by the countermeasure system are preamplified by the amplifier 12 and applied to the RF memory 14 which converts the RF signal into lower frequency signals and digitizes these signals for storage in a digital electronic memory. After a suitable delay period, and under the control of suitable system control apparatus which is not shown in FIG. 1, the stored digital values are retrieved from the memory and reconverted into the RF signal, amplified by amplifier 16, and transmitted back to the radar system through the antenna 18. There are various types of conditioning of the retransmitted RF signal which can be accomplished by the countermeasure system, such as changing the delay time and changing the frequency of the retransmitted signal, to mimic or give the illusion that the object returning the radar echo is moving or accelerating differently than it is in reality. Regardless of the conditioning or changes in the retransmitted radar signal, it is necessary in a modern countermeasure system to be able to store the exact signal as received as quickly and conveniently as possible, and to use this signal as the basis for applying any changes or alterations for the finally retransmitted signal.

Figure 2:
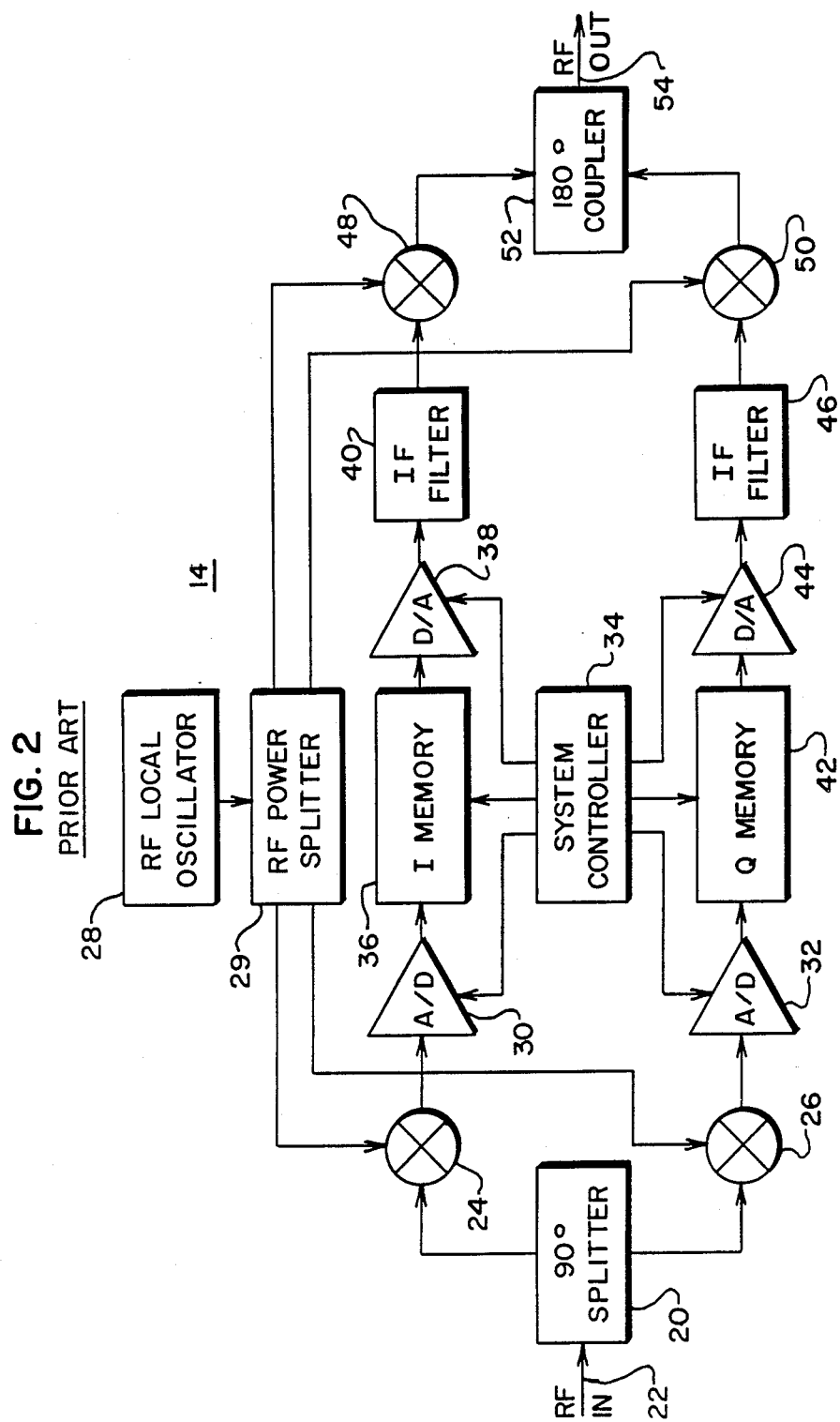
FIG. 2 is a block diagram of a typical two-channel DRFM of conventional design.

The coherent RF memory 14 is usually provided by a digital radio frequency memory (DRFM) which combines the use an interaction of both radio frequency components and slower speed analog and digital components. FIG. 2 is a block diagram of a typical two-channel, quadrature, DRFM which may be used for the coherent RF memory 14 shown in FIG. 1. Although other systems may be available, the DRFM shown in FIG. 2 represents the current state of the art and is, at this time, regarded as the most efficient way of storing radio frequency information into a digital memory for delay purposes.

According to FIG. 2, a typical two-channel DREM includes a 90-degree phase splitter 20 which splits the RF input signal 22 into two components which are 90 degrees out of phase. The signal applied to the mixer 24 has the same phase as the incoming RF signal, whereas the signal applied to the mixer 26 is 90 degrees out of phase with the signal applied to mixer 24. Mixer 24 is associated with one channel of the memory system, which is commonly denoted as the I channel. Mixer 26 is associated with the other channel of the memory system, which is commonly denoted as the Q channel.

A common RF local oscillator 28 applies its output signal to both mixers 24 and 26 after being divided by the RF power splitter 29, as shown in FIG. 2. The local oscillator signals and the RF signals applied to the mixers 24 and 26 produce intermediate frequency (IF) signals which are applied to the analog-to-digital (A/D) converters 30 and 32. These IF signals, being much lower in frequency than the incoming RF signal, can be converted into digital values at the sampling speed of the converters 30 and 32. According to the widely recognized Nyquist Sampling Theorem, the highest IF frequency which can be adequately converted by the converters 30 and 32 is one-half the sampling rate at which the converters operate. Therefore, the useful bandwidth of the system, which is dependent upon the highest frequency in the IF which can be accurately converted by the analog-to-digital converters, is limited by the sampling speed of the converters 30 and 32. Since increasing the sampling speed of the converters is basically a technological constraint which traditionally has increased only with new advances in technology, the bandwidth of the DRFM is primarily governed by advances in A/D converter speed capabilities. Thus, in order to increase the operating bandwidth of the DRFM system shown in FIG. 2, it has been widely regarded that the operational speed of the digital sampling components of the system must be increased.

The digital values from the converter 30 are applied, under the control of the system controller 34, to the I channel memory 36. When these values are recalled from memory 36, also under the control of the system controller 34, the values are applied to the digital-to-analog (D/A) converter 38 which converts the digital values into an analog signal for application to the IF filter 40. In a similar fashion, the digital values from the A/D converter 32 are stored in the Q channel memory 42 for later retrieval and application to the D/A converter 44 and the IF filter 46. Once the reconverted analog IF signals are filtered, they are applied to the mixers, or converters, 48 and 50 which mix the local oscillator signal with the IF signals to reproduce the original RF signal at the output of the two mixers 48 and 50. These signals are applied to a coupler 52 which combines the two signals 180 degrees out of phase to produce a final RF output 54 in which the mixer images are cancelled.

One-bit digitizing, or polarity detection, has been found to be one of the most economical trade-offs between system complexity and performance. By using a one-bit sampling or digitizing process for the converters and the memory storage, the number of bits required in the storage devices is considerably less than if multiple bit resolution for the conversion systems was used. A disadvantage in the one-bit sampling technique is the generation of spurious frequencies or spectral lines (spurs) which develop at the intermediate frequency level of the DRFM and carry through to the regenerated RF output signal. Consequently, when using conventional DRFM technology as shown in FIG. 2, there is a trade-off in performance necessitated by the speed and hardware advantages of one-bit sampling and the purity of the stored and reproduced signals. Although the main conversion image is eliminated by the use of the two phase shifted channels, the spurs are not reduced and the performance of the overall memory system is somewhat reduced by the presence of spurs in the reconstructed RF output signal 54.

By way of quantitizing the efficiency or performance of the memory system shown in FIG. 2, the amount of memory needed to store information over a specified bandwidth can be considered. According to the two-channel memory system, the memories 36 and 42, each of a specific bit capacity, are required to provide a memory system having a bandwidth capability which extends up to one-half the sampling rate of the digital converters and the storage rate applied to the memories. As will be described in more detail herein, the memory device of the present invention uses the same memory capacity as one of the memories 36 or 42 shown in FIG. 2 and also allows for a usable bandwidth up to the full sampling and storage speed of the digital and memory components. Thus, the new memory system of the present invention permits an improvement of four times the memory requirement for the same overall bandwidth storage capabilities.

Figure 3:
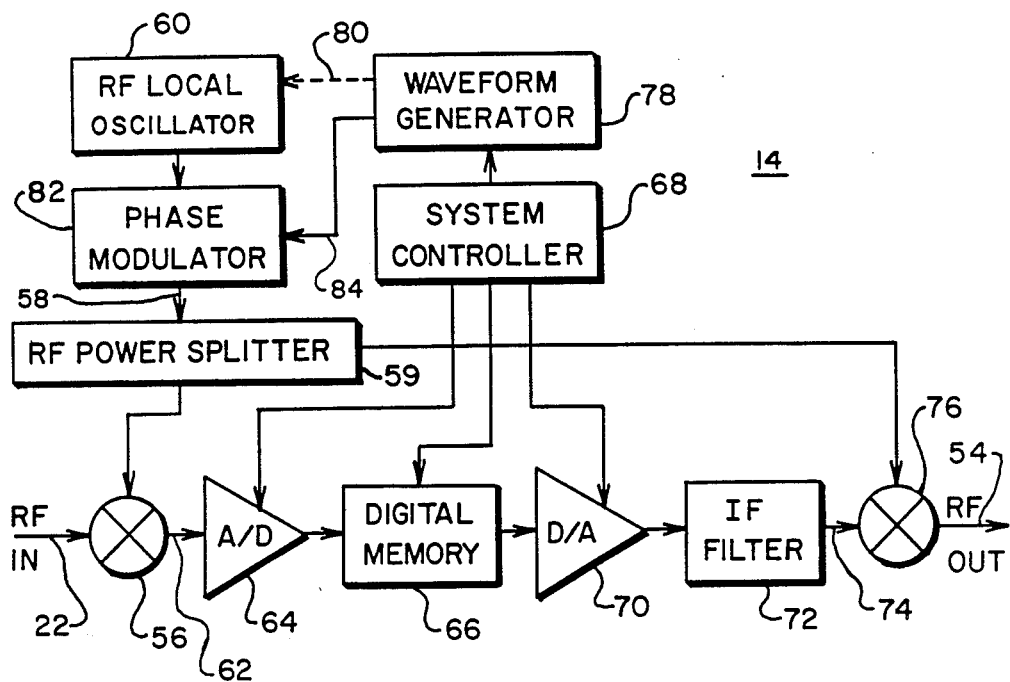
FIG. 3 is a block diagram of a one-channel DRFM constructed according to this invention.

FIG. 3 is a block diagram of a digital radio frequency memory constructed according to a specific embodiment of this invention. It is able to accurately process twice the bandwidth as compared to conventional two-channel systems, while using only one-half the digital memory used in the prior art system. According to FIG. 3, the RF input signal 22 is applied to the mixer, or converter, 56. A local oscillator signal 58, originating from the RF local oscillator 60, is also applied to the mixer 56 after passing through the RF power splitter 59. The result is an analog IF signal 62 which is applied to the analog-to-digital converter 64. The digital values from the converter 64 are stored in the digital memory 66 and later retrieved, under control of the system controller 68, and applied to the digital-to-analog converter 70. The converter 70 converts the digital values back into an IF signal which is filtered by the low pass filter 72. Since the memory system of FIG. 3 is capable of operating with a bandwidth up to the full sampling rate, or clock frequency, of the digital converters, the IF filter 72 has a cutoff frequency equal approximately to the sampling frequency of the digital components used in the system. Therefore, this cutoff frequency is twice that of the Nyquist limit normally associated with sampled and digitized signals, and twice the cutoff frequency of the filters used in the prior art arrangement shown in FIG. 2.

The filtered analog IF signal 74 is applied to the mixer 76 along with the local oscillator signal 58. Mixing these two signals provides the RF output signal 54 which is a true representation of the input RF signal 22, except for the delay caused by the conversion and storage into the digital memory 66, and any controlled delay governed by the system controller 68.

In order for the system of FIG. 3 to perform properly, the local oscillator signal 58 must be modulated when it is being used by the mixers 56 and 76. A waveform generator 78 is used to develop the desired waveform for the modulation. This modulation waveform is applied either directly to the RF local oscillator 60, as shown by the line 80, or to the phase modulator 82, as shown by the line 84. When frequency modulating the RF local oscillator 60, the phase modulator 82 would ordinarily not be used. When the waveform generator 78 is used in conjunction with the phase modulator 82, no connection is made to the RF local oscillator 60. In any event, whether by direct frequency or by phase modulation of a constant frequency, the local oscillator signal 58 consists of a modulated local oscillator signal which is properly modulated for application to the mixers 56 and 76.

Figure 4:
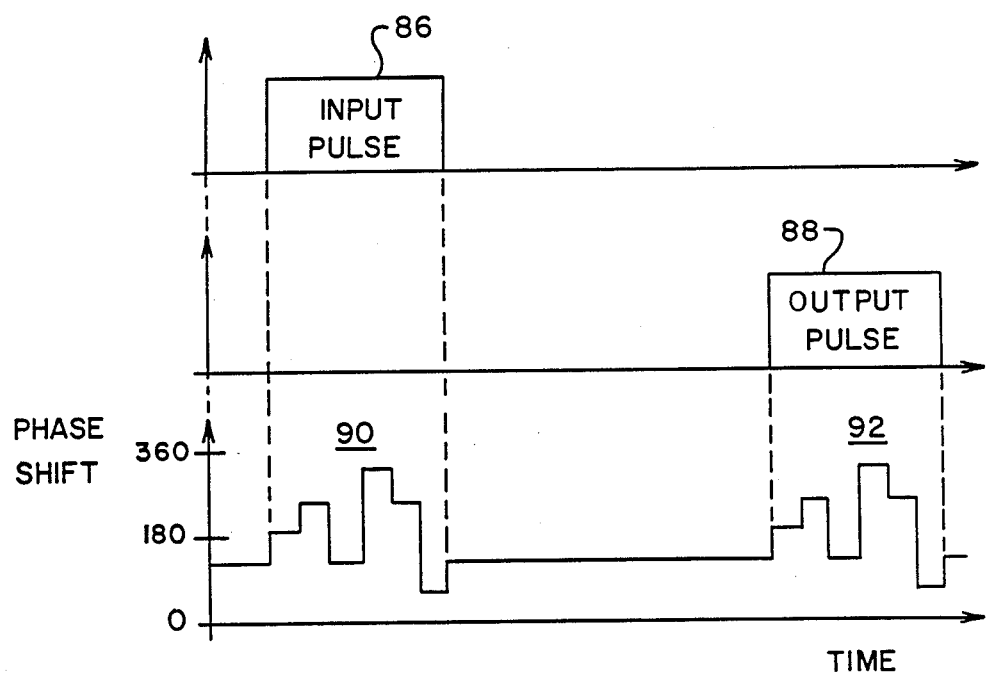
FIG. 4 is a graph showing modulation waveforms used in the preferred embodiment of the invention.

FIG. 4 is a graph illustrating the modulation waveform used in this preferred embodiment of the invention, together with the timing of the modulation waveforms with respect to the input and output RF signals. The received radar signals normally applied to the DRFM are short pulses of RF signals. As shown in FIG. 4, an input pulse 86 may consist of a short time period of radio frequency signal having a carrier frequency in the gigahertz range. For example, the input pulse may be at a carrier frequency of 3100 megahertz, with the pulse width equal to 1 microsecond. By way of further example, this same pulse is to be outputted 5 microseconds later, as represented by the output pulse 88. Only the power envelope of the RF input and output is shown in FIG. 4, not the actual carrier. Digitizing, or converting, and storaging into the memory occur between the input and output pulses. It is important that the waveform of the phase modulation shown in FIG. 4 be identical on both the input pulse and the output pulse. That is to say that the waveform 90, which represents an example of the phase modulation of the local oscillator signal applied to mixer 56 shown in FIG. 3, be exactly the same as the waveform 92, which represents the phase modulation which is applied to the local oscillator signal 58 when it is applied to the mixer 76 during the output pulse reconstruction.

Referring also to FIG. 3, the waveform generator 78 is controlled by the system controller 68 such that the waveform applied to the phase modulator 82 is represented by the example waveform 90 in FIG. 4 when the input pulse exists in the RF input signal 22. When the digital data representing this pulse is retrieved from the memory to reconstruct the output RF signal 54, the waveform generator 78 is controlled to provide the modulation waveform 92 to the phase modulator 82, which modulates the local oscillator signal 58 for application to the mixer 76. Whether direct frequency modulation is used, or phase modulation as the example shown in FIG. 4 illustrates, the modulated local oscillator signal 58 has the same modulation when the output signal is reconstructed as when the input signal was converted into digital values and stored into the digital memory.

Modulating waveform 90, and also waveform 92, according to this preferred embodiment of the invention, consist of a random, discrete level, digital stepwave which, in this example, changes phase levels six times during the duration of the pulse. The random nature of the modulation reduces the spur content in the IF and reconstructed RF signals, as will be described in more detail herein, and as described in connection with FIG. 5. In other words, the modulation envelope, or waveform patterns 90 and 92, would be changed to another random waveform for another pulse in the input RF signal. A pseudo random modulation waveform may also be used, and is the preferred embodiment of the invention since it would be easier to generate with conventional digital devices. With the pseudo random waveform, a series or plurality of pulses in the input RF signal would be converted by using random waveform modulation. However, after many pulses, the waveform would eventually repeat. For example, a random waveform may be applied to blocks of 100 pulses; however, every block of 100 pulses would have the same waveforms applied to its pulses.

Figure 5:
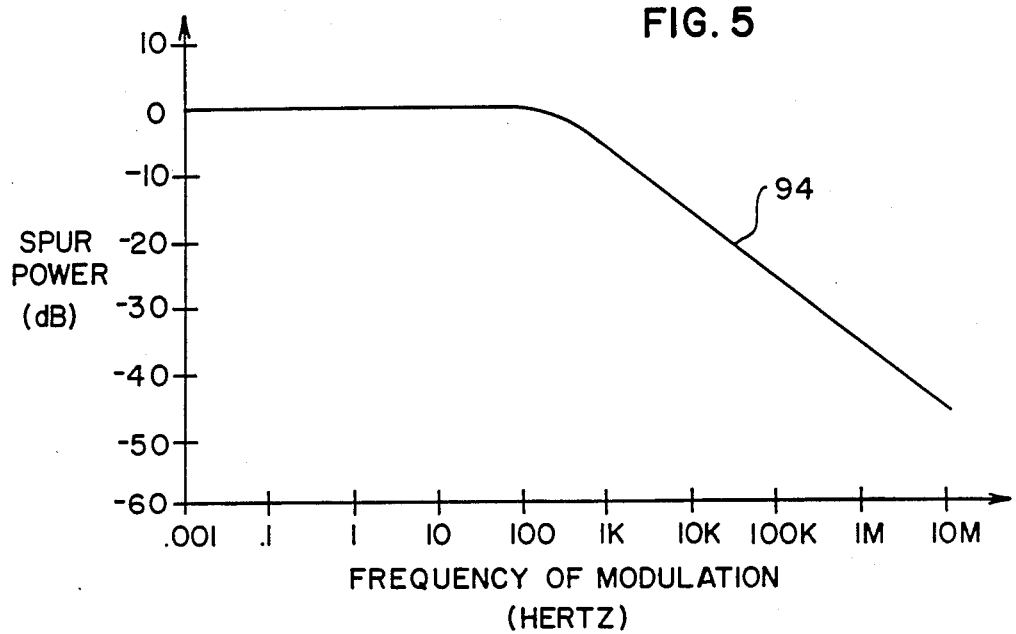
FIG. 5 is graph depicting the relationship between the IF spurious signal reduction and the frequency of modulation.

One of the advantages of applying the modulation to the local oscillator signal is the reduction of the spur level in the IF signal which is digitized for storage in the memory of the DRFM. FIG. 5 is a graph illustrating the spur power as a function of the frequency of modulation of the local oscillator signal when phase modulated and measured by a 100 hertz receiver. As can be seen from the graph of FIG. 5, modulating the local oscillator can reduce the spur level or energy in the IF signal. Curve 94 of FIG. 5 is valid for random waveform modulation applied to a very long pulse and would not be as sharply attenuating of the energy spurs if a non-random waveform was used. Although a repeating waveform can be used for each pulse, there begins to occur some correlation between the spurs and their energy does not dissipate or attenuate as much as that depicted by the curve shown in FIG. 5.

Figure 6:
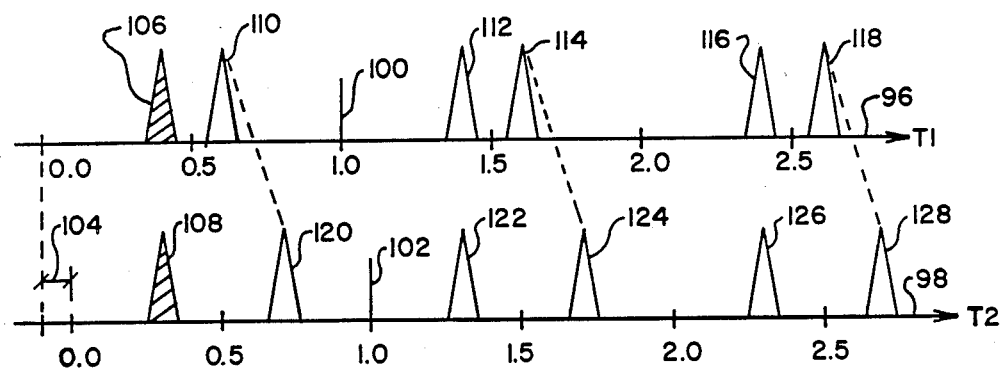
FIG. 6 is graph illustrating the decorrelating of IF spurs when the desired IF signal is within the Nyquist limit.
Figure 7:
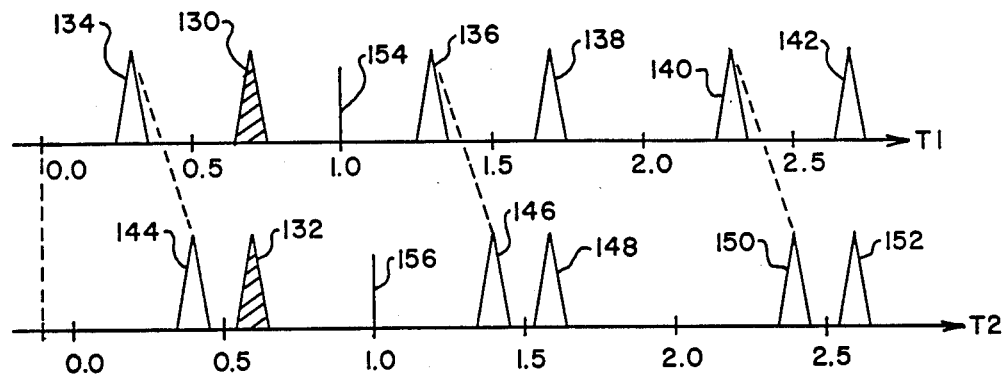
FIG. 7 is graph illustrating the decorrelating of IF spurs when the desired IF signal is above the Nyquist limit.
Figure 8:
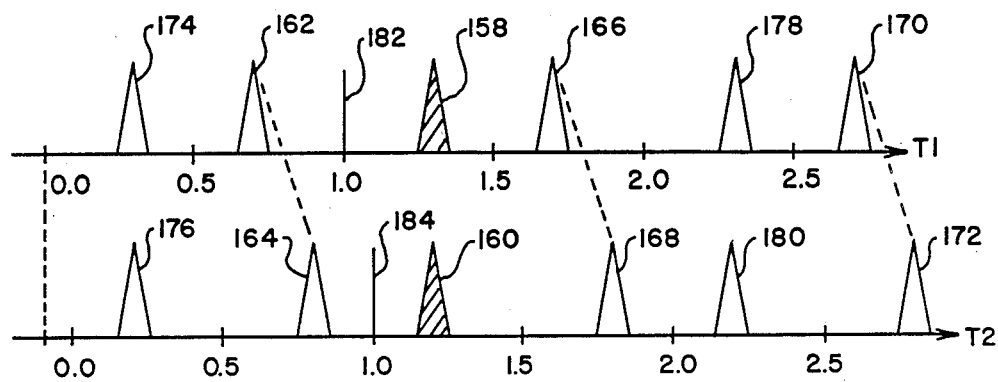
FIG. 8 is a graph illustrating the decorrelating of IF spurs when the desired IF signal is above twice the Nyquist limit.

FIGS. 6, 7 and 8 are graphs illustrating the decorrelating of the IF spurs when the desired intermediate frequency signal is at certain positions in the IF spectrum with respect to the Nyquist limit, or one-half the sampling rate. These figures illustrate how the decorrelating of the spurs in the IF signal permit the operation of the memory of this invention with twice the bandwidth capability of the prior art memory systems and with the need for only a one-channel memory system.

FIG. 6 represents the condition where the desired carrier frequency in the IF spectrum is below the Nyquist limit, or one-half the sampling speed. Axis 96 corresponds to the IF spectrum at one instant of time, and axis 98 represents the IF spectrum when the low frequency signal is modulated such that the frequency of the local oscillator signal is shifted toward the RF carrier signal. In other words, axis 98 represents the IF spectrum when the local oscillator signal has shifted frequency toward the RF signal, thereby causing the RF carrier signal at the IF level to move down in frequency. In constructing the graphs of FIGS. 6, 7 and 8, infinite-bit sampling has been assumed in order to reduce the number of spurs which need to be illustrated, in the interest of clarity. Although under actual conditions with one-bit sampling more spurs would exist than those shown in the figures, the decorrelating characteristics, as will be discussed, would be the same. In addition, the IF spectrums shown in the figures are generated by linear frequency modulation on line 80 applied to the local oscillator signal. Phase modulation on line 84 would produce the same advantages of the invention though it would be more complex to describe than this linear FM sweep on line 80.

Again referring to FIG. 6, the sampling rate of the digital converters in the DRFM is plotted on a normalized scale, with 1.0 representing the sampling frequency in each graph, and 0.5 representing what is normally considered the Nyquist limit. Thus, lines 100 and 102 represent the sampling rate of the DRFM at both times T1 and T2. At time T2, as previously described, the local oscillator signal is closer to the RF signal, causing a shift in the IF spectrum as illustrated by the distance 104. In FIG. 6 this distance is equal to one-tenth of the sampling clock frequency. The desired signal is the converted IF carrier signal of the RF carrier, shown cross hatched in FIG. 6. This is represented by the spectrum signals 106 and 108 for the two instants of time. Although signals 106 and 108 are at different absolute frequencies on the scales 96 and 98, they combine in the output converter 76 of the DRFM and are shifted back in frequency by the local oscillator signal 58 so that they correlate in the output RF signal 54. This correlation is depicted graphically by the vertical alignment of the signals 106 and 108 in FIG. 6. The signals which are aligned vertically in FIGS. 6, 7 and 8 are correlated and combine in the final RF output signal 54 to produce well defined output signals.

The spurious signals, or spurs, shown in FIG. 6 include the signals 110, 112, 114, 116, 118, 120, 122, 124, 126 and 128. The spurs which do not align vertically, such as spurs 110 and 120, 114 and 124, and 118 and 128, do not correlate and therefore decorrelate in the IF spectrum. In other words, these signals do not maintain a constant frequency relationship with the desired carrier frequency signals 106 and 108 and decorrelate in the IF spectrum. Consequently, these signals do not reinforce each other or correlate and do not become well defined and significant signal components in the IF signal. Instead, they are relegated to the noise floor of the IF spectrum and are insignificant as far as processing of the signals is concerned for radar electronic countermeasure applications.

FIG. 6 also shows that the spurs 112 and 122 are aligned vertically, thus indicating that they correlate in the IF spectrum and will cause a significant spur to appear in the IF signal. A similar situation exists with the spurs 116 and 126. This indicates that the IF spectrum which includes these correlating spurs would not be useful because of the ambiguous spur content. Therefore, according to the example shown in FIG. 6, which is that the desired signals 106 and 108 are below one-half the sampling frequency, the useful bandwidth extends up to the sampling frequency of 1.0 and not beyond. In other words, the bandwidth is limited to the sampling frequency of 1.0 since the IF passband above 1.0 contains spurs which correlate and will produce ambiguous results. The IF filter 72, shown in FIG. 3, has an IBW from 0 to 1.0, using the scale of FIG. 6. It is understood that the total bandwidth of the system, or the instantaneous bandwidth (IBW), would be twice the value shown in the simplified IF spectrum distribution shown in the graph of FIG. 6. This is because the instantaneous bandwidth exists on both sides of the local oscillator signal, depending upon which side the carrier frequency exists. That is, the RF IBW extends from the LO frequency minus the sampling rate to the LO frequency plus the sampling rate.

By way of an example to better illustrate the frequency relationships between the signals shown in FIG. 6, let it be assumed that the local oscillator frequency is operating at a frequency of 3,000 megahertz, the RF carrier input frequency is 3,400 megahertz, and the sampling frequency is 1,000 megahertz, all at time T1. Under these conditions, the desired carrier signal at the IF level would be 400 megahertz, as represented by signal 106 in FIG. 6 which is centered at 400 megahertz. The sampling frequency of 1,000 megahertz is represented by line 100 at the normalized frequency of 1.0. At time T2, the frequency of the local oscillator moves toward the RF signal by 100 megahertz, to 3,100 megahertz. Thus, the RF carrier input signal produces an IF signal at 300 megahertz, as represented by signal 108 in FIG. 6. Accordingly, the shift 104 in the IF spectrum of FIG. 6 is 100 megahertz.

In order to determine the upper limit of the bandwidth usable by the memory system of this invention, the intermediate frequency signal produced by the desired RF carrier signal will be increased to other values to determine the spur correlation in the IF spectrum. FIG. 7 represents the condition where the RF input signal produces IF signals 130 and 132 at times T1 and T2, respectively. For the values indicated above in the example, the only difference would be that the input RF carrier signal would be at a frequency of 3,700 megahertz rather than 3,400 megahertz. Thus, the desired IF signals corresponding to the desired RF input exist at 700 megahertz as represented by signal 130 and at 600 megahertz as represented by signal 132. Since these correlate vertically in FIG. 7, they will be reproduced accurately at the output of the DRFM. The spurs in this idealized spectrum diagram include the spurs 134, 136, 138, 140, 142, 144, 146, 148, 150 and 152. The spurs 134 and 144 located below the sampling rate, shown as lines 154 and 156, do not align vertically, thus decorrelate and are moved into the noise floor of the IF spectrum. A similar result occurs for the spurs 136 and 146, and 140 and 150. However, spurs 138 and 148 correlate, as do spurs 142 and 152. From this it can be seen that a bandwidth up to 1.5 times the sampling frequency, or 1,500 megahertz in the example, can be free of correlated spurs when the desired IF signal is between the sampling frequency and one-half the sampling frequency.

By using the results of both FIGS. 6 and 7, it can be determined that the IF spectrum is usable up to the sampling frequency (1,000 megahertz in the example) when the RF carrier produces signals which are below the sampling frequency. Since the Nyquist limit is one-half the sampling frequency, the ability to use the IF spectrum when the desired IF carrier signals are between the Nyquist limit and sampling rate, that is between 0.5 and 1.0 on the graphs, is an improvement over the range available with prior art DRFMs.

FIG. 8 illustrates the condition wherein the desired RF signal produces IF signals 158 and 160 which are above the sampling rate of the system. Signal 158 would be produced when the above example values are used if the RF input frequency was 4,300 megahertz at times T1 and T2. The spurs which decorrelate in this example are spurs 162 and 164, 166 and 168, and 170 and 172. However, spurs 174 and 176, and 178 and 180 align vertically, thereby representing that they correlate in the IF spectrum and would not be absorbed in the noise floor of the overall IF spectrum. Thus, because of spurs 174 and 176 being located in the bandwidth spectrum originally considered as valid from the tests of FIG. 6 and FIG. 7, it is to be concluded that the usable bandwidth does not include the region up to the sampling rate, represented by lines 182 and 184, when the desired carrier IF signal is above the sampling rate. Therefore, by considering all the graphs of FIGS. 6, 7 and 8, it can be determined that, when the carrier frequency produces a desired IF signal at or below the sampling frequency of the DRFM, the IF spectrum will be void of any correlating spurs up to the sampling clock frequency, when the circuit and modulation techniques taught by the specific embodiment of this invention are used.

It is emphasized that no statement in this patent should be interpreted as meaning that the disclosed hardware violates the true meaning of the Nyquist Sampling Theorem, even though the disclosed hardware operates successfully at sampled signal frequencies that are above what is normally considered to be the Nyquist limit.

Because of the decorrelation of the spurs produced by this invention, the output signal is virtually spur free, with the spurs caused by the one-bit sampling being decorrelated and spread over the IF spectrum to develop a noise floor which is not destructive or offensive for the applications intended. In addition to the decorrelating of the spurs, the conversion image is also decorrelated and absent from the reproduced RF signal as an unwanted frequency component. Consequently, the one-channel DRFM of this invention can give the performance of the two-channel prior art system, which required the second channel to cancel out the image. Thus, for a given instantaneous bandwidth, the disclosed invention would use nine less couplers, six less mixers, six less digital converters, only 25 percent of the digital memory, and, in some cases, one less local oscillator than the prior art arrangement. These substantial hardware reductions to obtain the same bandwidth and memory storage capability are significant in economical, cost effective, and reliable ECM development.

Figure 9:
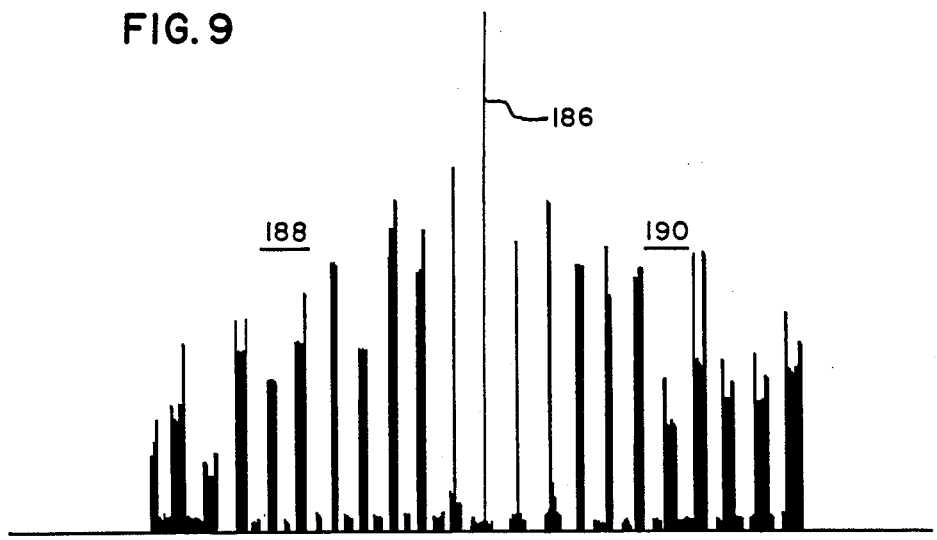
FIG. 9 is a sketch of a spectrum analyzer pattern obtained without modulation of the local oscillator of the invention.

FIG. 9 is a sketch of a spectrum analyzer pattern obtained experimentally from a circuit similar of the circuit of FIG. 3. The spectrum of FIG. 9 was produced with zero deviation, or no frequency modulation of the local oscillator. The main and desired frequency component, shown by line 186, exists in the spectrum with a multitude of spurious signals 188 and 190. The input frequency was a constant continuous wave frequency of 3,400 megahertz and the local oscillator frequency was 3,600 megahertz.

Figure 10:
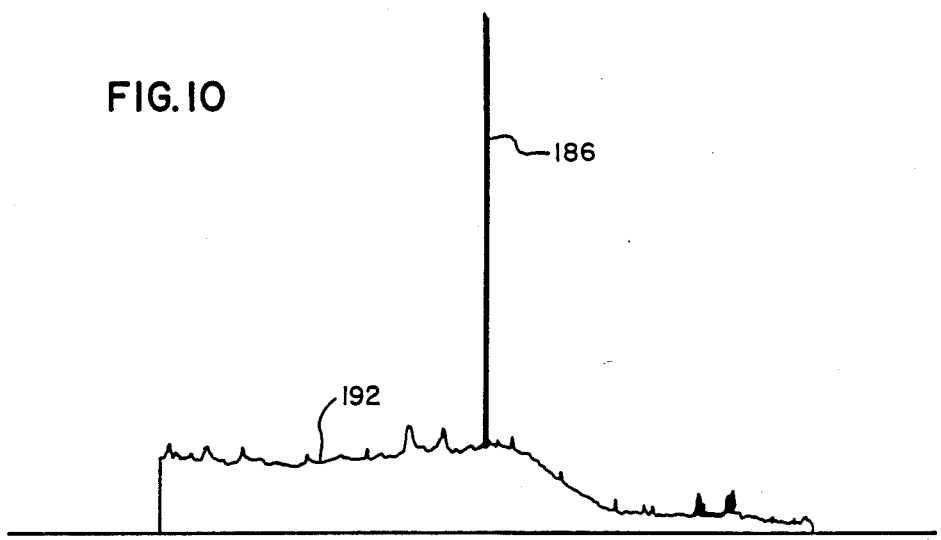
FIG. 10 is a sketch of a spectrum analyzer pattern obtained with frequency modulation of the local oscillator.

FIG. 10 is a sketch of a spectrum analyzer pattern obtained from the same circuit as FIG. 9 with the only change being that the local oscillator was modulated at a deviation of 11.5 megahertz and a 62 hertz modulating frequency. As can be seen, the desired signal, represented by line 186, exists in the specturm without the multitude of high energy spurs adjacent thereto. Spurs 188 and 190 of FIG. 9 have been decorrelated by the modulation and circuitry technique of this invention to reduce them to the noise floor level 192 shown in FIG. 10. It is commonly accepted that the spectrum shown in FIG. 10 is much more useful and easier to process than the spectrum shown in FIG. 9.

There has been disclosed herein a unique and advantageous digital radio frequency memory system which, because of its unique construction and modulating techniques, gives performance equivalent to the prior art system with a significant reduction in the required hardware. Because the disclosed invention uses only-half the memory of the conventional two-channel system, a 50 percent reduction in memory hardware requirements is possible. In addition, since the invention disclosed herein is capable of using twice the bandwidth of the prior art system, there would be another 50 percent savings in memory requirements for systems requiring storage of signals over the same bandwidth limits. Besides these improvements, the DRFM of this invention is relatively free of bothersome spur signals within the usable bandwidth, and the variable local oscillator signal eliminates the problems of the prior art circuit with holes in the center of the operating bandwidth due to the low frequency being near the input RF frequency.

It is emphasized that numerous changes may be made in the above-described system without departing from the teachings of the invention. It is intended that all of the matter contained in the foregoing description, or shown in the accompanying drawings, shall be interpreted as illustrative rather than limiting.

I claim as my invention:

1. A modulated digital radio frequency memory suitable for use as a coherent radio frequency memory in a military electronic countermeasure system, said memory comprising:
   an RF local oscillator;
   means for modulating the signal from said local oscillator;
   a first mixer for converting an RF input signal and the modulated local oscillator signal into an IF signal;
   an A/D converter for converting said IF signal into digital values;
   digital memory means for storing said digital values for later retrieval;
   a D/A converter for converting retrieved digital values into an analog signal;
   an IF filter for filtering said analog signal;
   a second mixer for converting the filtered analog signal and said modulated local oscillator signal into an RF output signal; and
   means for controlling the modulating and memory means such that the modulation on the local oscillator signal which is applied to the second mixer when specific digital values are being retrieved from the digital memory means is identical to the modulation which was on the local oscillator signal applied to said first mixer when said specific digital values were derived and stored in the digital memory means.

2. The digital radio frequency memory of claim 1 wherein the modulating means phase modulates the signal from the local oscillator.

3. The digital radio frequency memory of claim 1 wherein the modulating means modulates the local oscillator signal with a pseudo random waveform.

4. The digital radio frequency memory of claim 3 wherein the pseudo random waveform contains discrete digital levels.

5. The digital radio frequency memory of claim 1 wherein the A/D and D/A converters have predetermined and equal sampling frequencies and wherein the IF filter is a low-pass filter having a cut-off frequency equal to said sampling frequency.

6. The digital radio frequency memory of claim 1 wherein the modulating means frequency modulates the local oscillator.

7. The digital radio frequency memory of claim 1 wherein the A/D and D/A converters perform one-bit conversions of the signals.

8. A modulated digital radio frequency memory suitable for use as a coherent radio frequency memory in a military electronic countermeasure system, said memory comprising:
   an RF local oscillator (60);
   a phase modulator (82) for modulating the phase of the signal from the local oscillator;
   a waveform generator (78) for developing a pseudo random modulation waveform for use by the phase modulator (82), said waveform containing discrete digital levels;
   a first mixer (56) for converting an RF input signal (22) and the modulated local oscillator signal (58) into an IF signal;
   an A/D converter (64) for converting said IF signal into one-bit digital values;
   a digital memory (66) for storing said digital values for later retrieval;
   a D/A converter (70) for converting retrieved one-bit digital values into an analog signal;
   a low-pass filter (72) for filtering said analog signal, said filter having a cut-off frequency equal to the sampling frequency used by said converters;
   a second mixer (76) for converting the filtered analog signal (74) and the modulated local oscillator signal (58) into an RF output signal (54); and
   controlling means (68) for synchronizing the waveform generator (78) and the digital memory (66) such that the modulation (92) on the local oscillator signal which is applied to said second mixer (76) when specific digital values are being retrieved from the digital memory means (66) is identical to the modulation (90) which was on the local oscillator signal applied to said first mixer (56) when said specific digital values were derived from an RF signal and stored in the digital memory (66).

9. A method of storing an RF signal in and retrieving a similar RF signal from a digital memory, said method including the steps of:
   applying a modulated local oscillator signal and an input RF signal to a first mixer to produce an input IF signal;
   converting the input IF signal into digital values;
   storing said digital values in a digital memory;
   retrieving said digital values from the digital memory;
   converting the retrieved digital values into an output IF signal;
   applying a modulated local oscillator signal and the output IF signal to a second mixer to produce an output RF signal; and
   controlling the modulation on the local oscillator signals applied to the first and second mixers such that the modulation is identical when the stored and retrieved digital values correspond to the same RF signal.

10. The method of storing and retrieving an RF signal of claim 9 including the step of phase modulating the signal from a common local oscillator to produce the modulated signals applied to the first and second mixer.

11. The method of storing and retrieving an RF signal of claim 10 including the step of generating a pseudo random, discrete digital valued waveform for modulating the local oscillator signals.

12. The method of storing and retrieving an RF signal of claim 9 including the step of filtering the output IF signal such that the frequency components higher than the sampling frequency used in the converting steps are attenuated and that the frequency components lower than said sampling frequency are passed without attenuation.

13. The method of storing and retrieving an RF signal of claim 9 wherein the converting steps utilize one-bit digital values which digitally represent the analog signal at the sampled time instant.

* * * * *